(12) United States Patent
Johnson

(10) Patent No.: US 6,235,991 B1
(45) Date of Patent: May 22, 2001

(54) RECESSED MECHANICAL FASTENERS FOR CIRCUIT BOARDS

(75) Inventor: Michael Gunnar Johnson, Sparta, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/107,846

(22) Filed: Jun. 30, 1998

(51) Int. Cl.[7] .............................. H01B 1/00; H01B 17/00; H01R 9/09; H05K 1/00
(52) U.S. Cl. .................................. 174/70 R; 174/138 D; 174/202; 174/138 G; 174/266; 174/265
(58) Field of Search .............................. 174/250, 252, 174/255, 260, 138 G, 138 D, 70 R, 262, 266, 265; 361/702, 709, 718, 719, 720

(56) References Cited

U.S. PATENT DOCUMENTS

| | | | | |
|---|---|---|---|---|
| 4,574,330 | * | 3/1986 | Cohen et al. ....................... | 361/702 |
| 4,924,352 | * | 5/1990 | Sedtfons ............................. | 361/702 |
| 5,396,403 | * | 3/1995 | Patel .................................... | 361/705 |
| 5,473,510 | * | 12/1995 | Dozler, II ........................... | 361/719 |
| 5,661,639 | * | 8/1997 | Fuvuno et al. ...................... | 361/704 |
| 5,960,535 | * | 10/1999 | Rubens et al. ..................... | 29/832 |

* cited by examiner

*Primary Examiner*—Jeffrey Gaffin
*Assistant Examiner*—Kamand Cuneo
(74) *Attorney, Agent, or Firm*—Irena Lager

(57) ABSTRACT

An assembly including a back plate and a circuit board coupled to the back plate with mechanical fasteners is provided. The fastener has an end and a head with a top surface. The top surface of the head is between the top and bottom surfaces of the circuit board, inclusively, such that the head is either below or flush with the top surface of the circuit board. This allows solder to be deposited onto the circuit board with an automated surface mounted assembly system and components to be attached to the circuit board after the circuit board is attached to back plate. The circuit board has an opening that receives the head of the fastener. A portion of this opening has a diameter as large as the diameter of the widest portion of the head and another portion of this opening, located closer to the back plate has a smaller diameter.

7 Claims, 5 Drawing Sheets

RECESSED MECHANICAL FASTENERS FOR CIRCUIT BOARDS

FIELD OF THE INVENTION

This invention is related to fasteners for circuit boards, and more particularly to fasteners for coupling a circuit board to a back plate.

BACKGROUND OF THE INVENTION

In many applications it is advantageous to attach a back plate to a circuit board. The back plate is fairly rigid, fabricated out of a metal, and has about the same length and width as the circuit board. The circuit board is thin, on the order of 2 to 100 millimeters, and therefore difficult to handle and to work with because it bends and tends to warp. The additional thickness of an assembly of the circuit board attached to the back plate prevents the circuit board from bending and warping. This makes it easier to install components onto the circuit board, and easier to install the assembly into a device. The circuit board is made out of one or more layers. Some of the layers are made out of plastic or out of a plastic and glass compound. These layers have a conductor, such as copper, deposited on both sides to form a particular pattern of tracks that is the printed wiring. Other layers are made of an epoxy material and hold the circuit board together. Components attach to the circuit board and connect to the printed wiring. The back plate also acts as a heat sink to dissipate some of the heat generated by the components.

Typically, the back plate is attached to the circuit board with an epoxy. Some circuit boards can be attached to the back plates with solder. However, this is very expensive and would drastically increase the cost of the assembly. Other circuit boards, for example circuit boards with low glass transition temperatures, cannot be attached to the back plates with solder because this solder connection will melt when this assembly is heated to attach components to the assembly. Once the back plate and circuit board are attached, a solder paste stencil is applied to the circuit board. The solder paste stencil is a thin metal stencil that has areas cut out that correspond to the areas of the circuit board where the components will be attached. Solder is then applied. The solder goes through the areas cut out on the stencil such that solder is deposited on areas of the circuit board where the leads of the components will be attached. The leads of the components are placed on the solder, soldering the components onto the circuit board. Screws are then added to hold the back plate and circuit board together more securely.

A problem with fabricating the assemblies is that it is difficult and expensive to make an epoxy that can bond the metal back plate to the material of the circuit board. The epoxy must be tailored to the circuit board and back plate. The development of the epoxy takes both time and money, therefore increasing the cost and the time to start production. However, even when the epoxy is tailored to the circuit board and the back plate, the epoxy is not very reliable. A significant percentage of the circuit boards detach from back plates. This reduces the yield and therefore raises the cost and time of fabricating the assemblies.

Attaching the components to the circuit board prior to attaching the circuit board to the back plate solves the problem of using the epoxy, however, it creates a more serious problem. FIG. 1 shows circuit board 4 with components 6, 8 attached to circuit board 4 before circuit board 4 is attached to back plate 10. Attaching components 6, 8 to thin circuit board 4 before circuit board 4 is reinforced with back plate 10 causes circuit board 4 to warp and bend due to the mismatch in the thermal expansion coefficient between the board and the components 6, 8. This warped circuit board 4 is then screwed onto back plate 10. Back plate 10 is more rigid than circuit board 4 causing warped circuit board 4 to bend when it is screwed on back plate 10. This can cause the printed wiring on circuit board 4, circuit board 4 itself, components 6, 8, or the solder joints on components 6, 8, to crack, which disrupts connections and causes open circuits. This is particularly problematic when the crack in the printed wiring is difficult to detect, and the assembly is placed in a product and fails in the field.

Attaching the back plate to the circuit board with screws before soldering eliminates the need for the epoxy but it creates a more serious problem. FIG. 2 shows assembly 12 with screws 14, 16 attaching circuit board 18 to back plate 20. Back plate 20 also has openings 30 and 32. Openings 30 and 32 can be used for fasteners that fasten assembly 12 to the devise that receives assembly 12. Circuit board 18 also has openings 26 and 28. Openings 26 and 28 can be used for fasteners that fasten assembly 12 to the device that receives assembly 12. Back plate 20 and circuit board 18 include these openings 30, 32, and 26, 28, respectively, in addition to the opening for the screws 14, 16 that attach circuit board 18 to back plate 20. Circuit board 18 is typically too soft to be able to have threads to hold screws 14, 16 in place if their heads 22, 24 are positioned at the bottom of back plate 20. Therefore, heads 22, 24 need be positioned above circuit board 18. Heads 22, 24 have to be above at least a portion of circuit board 18 otherwise they will not hold circuit board 18 to back plate 20. In the cases of all but the thickest circuit boards, heads 22, 24 are taller than, or at least as tall as, the thickness of circuit board 18. Since heads 22, 24 need to be positioned above at least a portion of circuit board 18, at least a portion of heads 22, 24 protrudes above top surface 34 of circuit board 18.

Heads 22, 24 protruding over the top surface of circuit board 18 create raised areas in the top surface of assembly 12. If the solder paste stencil is placed on top surface 34 of circuit board 18, a gap is created between circuit board 18 and the stencil. The solder is then applied and will leak out onto circuit board 18. This will cause the solder to be deposited on areas of circuit board 18 where it does not belong, i.e. the areas of circuit board 18 where components do not need to be attached, resulting in short circuits. When components 36, 38 are attached to circuit board 18, some components 36 may attach to the solder that is deposited where it does not belong, resulting in incorrect connections and to open and short circuits. Depositing solder manually onto the circuit board instead of using the solder paste stencil, to avoid the solder leaking over the assembly, increases the cost and the time needed to manufacture assembly 12 to the point where it is prohibitively expensive to manufacture assembly 12.

SUMMARY OF THE INVENTION

The invention solves the above problems by providing a mechanical fastener that does not protrude above the surface of the assembly. The assembly includes a back plate and a circuit board coupled to the back plate with the mechanical fastener. The fastener has an end and a head with a top surface. The circuit board has an opening that receives the head of the fastener so that the top surface of the head is between the top and bottom surfaces of the circuit board, inclusively. A portion of this opening has a diameter at least as large as the diameter of the widest portion of the head. Another portion of this opening, located closer to the back plate has a smaller diameter.

The assembly is fabricated by forming an opening in the circuit board. A portion of the opening has a diameter as large as the largest diameter of the head of the fastener. An opening is formed in the back plate. The circuit board is attached to the back plate with the fastener. The top surface of the head of the fastener is placed entirely within the opening in the circuit board. If the circuit board is a multi-layer circuit board the circuit board is laminates. An opening is drilled through all of the layers in the circuit board. This opening has a diameter smaller than the largest diameter of the head. A larger opening is counterbored in the top layer of the circuit board around the drilled opening, at least portion of the opening in the top layer has a diameter as large as the largest diameter of the head of the fastener. If the circuit board is a singe-layer circuit board an opening is drilled through the layer. A portion of the opening has a diameter as large as the largest diameter of the head of the fastener. In either case, the circuit board is then plated.

Fasteners not protruding above the top surface of the assembly allow solder to be deposited onto the circuit board with an automated surface mounted assembly system and components to be attached to the circuit board after the circuit board is attached to back plate, saving both time and money, while at the same time increasing the yield for the assemblies.

BRIEF DESCRIPTION OF THE DRAWINGS

It should be noted that the Figures are drawn to best illustrate preferred embodiments of the invention and are not drawn to scale.

DETAILED DESCRIPTION

Figure 1:
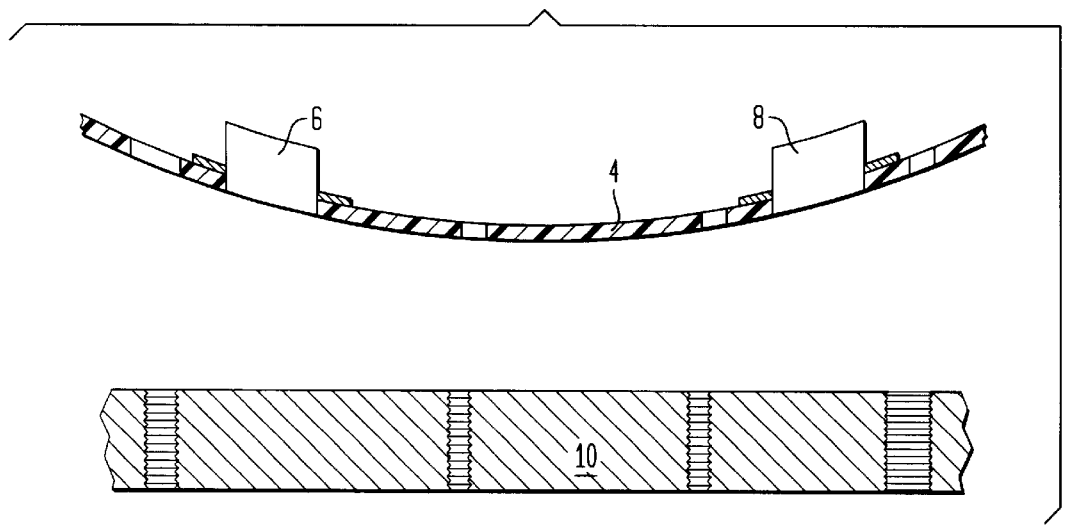
FIG. 1 is a cross-sectional view of a prior art back plate and a prior art circuit board to which components were attached before the circuit board was attached to the back plate.
Figure 2:
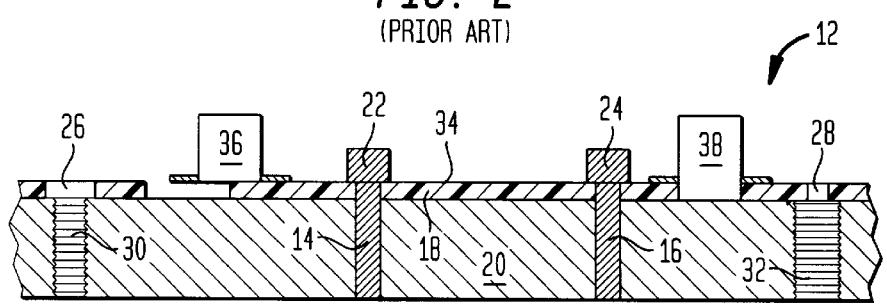
FIG. 2 is a cross-section of a prior art assembly having a back plate attached to a circuit board by screws before solder is applied to the circuit board.
Figure 3:
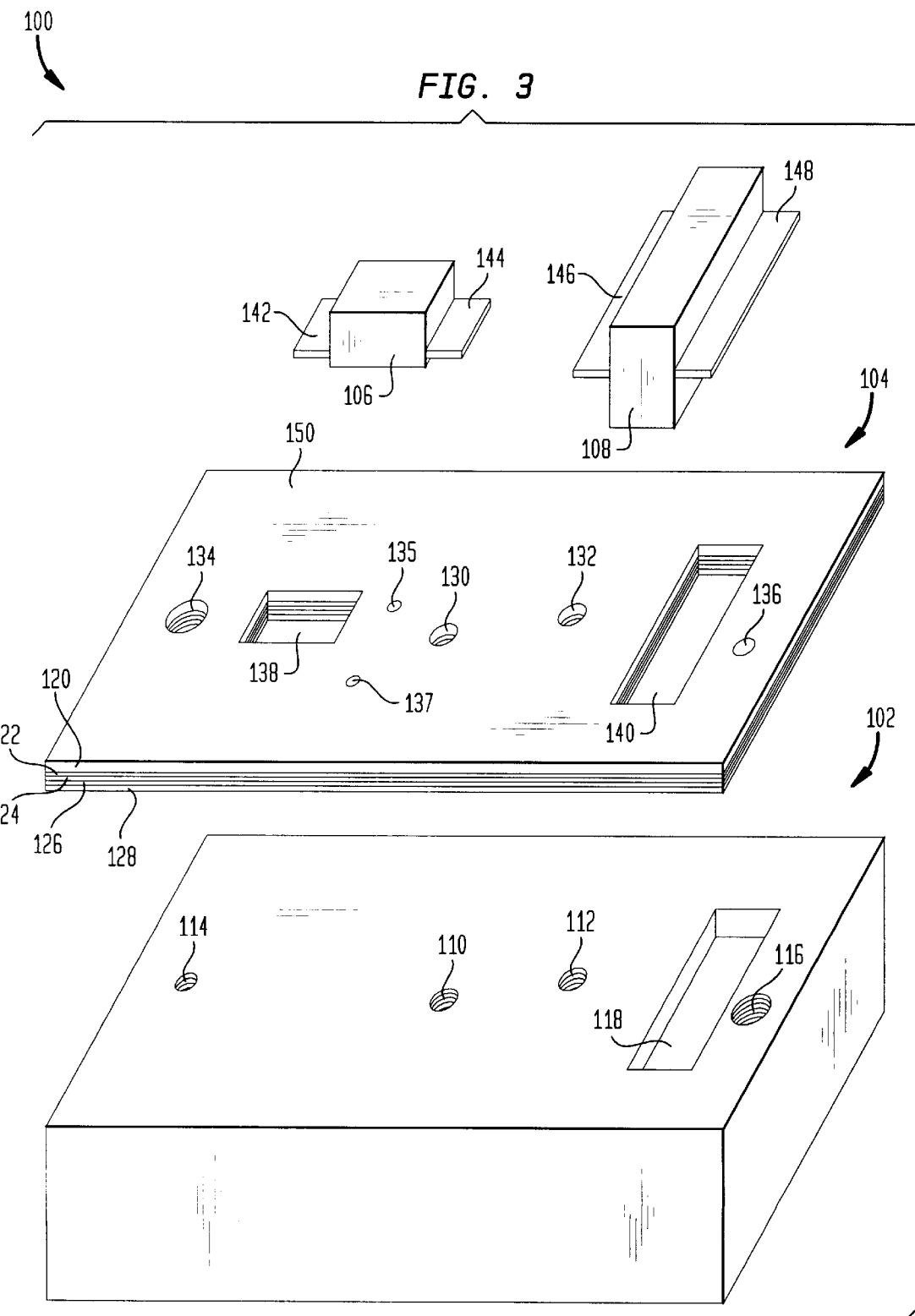
FIG. 3 is an exploded view of an assembly having a back plate, a circuit board, and components according to one embodiment of the present invention.
Figure 4:
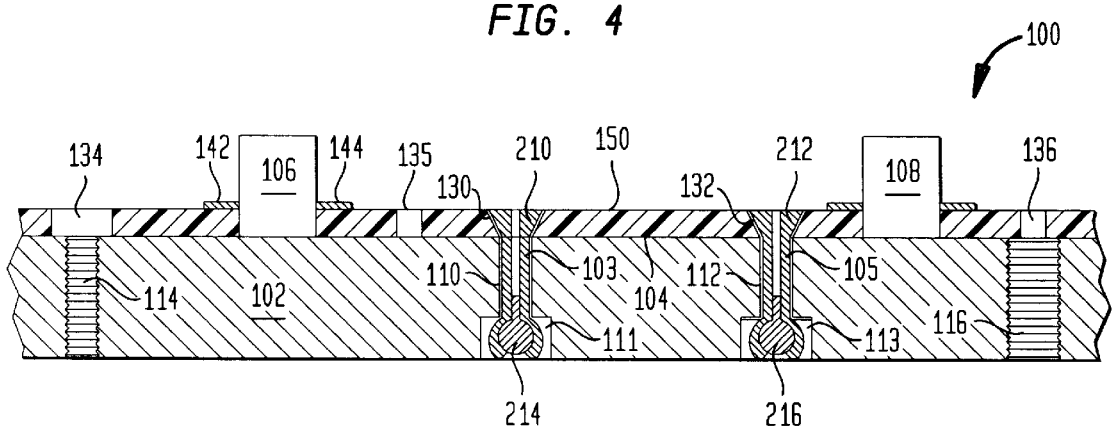
FIG. 4 is a cross-sectional view of an assembly having a back plate attached to a circuit board with countersunk rivets according to one embodiment of the present invention.

Referring to FIGS. 3 and 4, an assembly according to an embodiment of the present invention is generally designated by reference numeral 100. Assembly 100 includes back plate 102 coupled to circuit board 104 with mechanical fasteners 103, 105. Optionally, the assembly can also include components 106, 108.

Back plate 102 is made out of aluminum, or any other material that balances the desire to keep back plate 102 light and inexpensive, yet as highly thermally conductive as possible. Back plate 102 is thick enough to be rigid. Preferably, the length and width of back plate 102 are about the same as that of circuit board 104, although back plate 102 can be larger or smaller than circuit board 104. The length and width of back plate 102 should be large enough to keep circuit board 104 fairly rigid so that it does not bend, warp, or move. Keeping circuit board 104 fairly rigid makes circuit board 104 easier to work with as components 106, 108 are attached to assembly 100 and as circuit board 104 is installed in a device that receives assembly 100.

Back plate 102 has fastener openings 110, 112 for fasteners that fasten back plate 102 to circuit board 104. Depending on the shape of the fasteners, fastener openings 110, 112 either run through the entire depth of back plate 102, or the fastener openings extend through only a part of back plate 102. For fasteners such as rivets, fastener openings 110, 112 run through the entire depth of back plate 102. The bottom of fastener openings 110, 112 have recessed areas 111, 113. Back plate 102 also has other openings 114, 116, 118. Opening 118 accommodates component 108. Openings 114, 116 are for fasteners that fasten assembly 100 to the devise that receives assembly 100.

Circuit board 104, like the conventional circuit board, is typically thin, on the order of 2 to 10 millimeters, and is made out of one or more layers 120, 122, 124, 126, 128. Layers 120, 124, 128 are made out of plastic or out of a plastic and glass compound, such as FR4. These layers 120, 124, 128 have a conductor, such as copper, deposited on either one or on both sides to form a particular pattern of tracks that is the printed wiring. Layers 122, 126 are made of an epoxy material and hold circuit board 104 together. Layer 128 has tracks that serve as power on one side, and tracks that serve as a power ground on the other. Layers 120, 124 have tracks that serve as connections for components 106, 108 on one side, and tracks that serves as ground on the other side, such as RF power and ground and digital power and ground. Circuit board 104 is laminated and electroplated.

Circuit board 104 has openings 130, 132 for fasteners that fasten circuit board 104 to back plate 102, and openings 134, 136 for fasteners that fasten assembly 100 to the device that receives assembly 100. Openings 130, 132, 134, 136 run through the entire depth of circuit board 104 and are positioned over openings 110, 112, 114, 116, respectively. Openings 130, 132, 134, 136, 135, 137 are electroplated, which allows them to conduct some of the current to ground tracks located on other layer in addition to the ground tracks on the layer with the transmission lines that generated the current. Openings 130, 132, 134, 136 and grounding openings 135, 137 help to connect the different ground layers and thereby reduce interference between signals on the printed wiring to an acceptable performance level. Openings 130, 132, 134, 136 and grounding openings 135, 137 should be placed as needed, preferably near the transmission lines of the printed wiring that carry high current at low impedance. Openings 130, 132, 134, 136. 135, 137 also conduct some of the current to back plate 102, which acts as a ground plane.

There should be enough openings 130, 132 and fasteners 103, 105 to make sure that circuit board 104 and back plate 102 are securely held together. Additionally, although only two grounding openings 135, 137 are shown, there should be enough grounding openings 135, 137 to make sure that current is conducted to ground to reduce any interference between signals to an acceptable performance level.

Circuit board 104 also has component openings 138, 140 that go through the entire depth of circuit board 104. Components 106, 108 fit through component openings 138, 140. Components 106, 108 are either integrated circuits or discrete devices that are connected to circuit board 104 through leads 142, 144, and 146, 148, respectively. Leads 142, 144, and 146, 148 connect to the printed wiring on top surface 150 of circuit board 104.

Fasteners fit into openings 130, 132, of circuit board 104 and openings 110, 112 of back plate 112 to fasten circuit board 104 to back plate 102. The fasteners are preferably countersunk rivets, such as flat head pop rivets 103, 105. Although, they can be any fasteners that can be recessed into circuit board 104 and still attach circuit board 104 to back plate 102, such as button-head pop rivets 170, 172 shown in FIG. 5, eyelets 180, 182 shown in FIG. 6a, funnel head eyelets shown in FIG. 6c, flat head press fit rivets, or button-head press fit rivets.

Fasteners that can be recessed into circuit board 104 and still attach circuit board 104 to back plate 102 can be of two basic types. The first type of fastener has a head whose height is smaller than the depth of circuit board 104, such as the eyelet, the button head rivets, or some of the flat head rivets. The second type of fastener has a head whose height is larger than the depth of the circuit board, but a portion of the head fits into the fastener openings such as some flat head rivets.

The shape of openings 130, 132 in circuit board 104, and the depth of recessed areas 111, 113 at the bottom of fastener openings 110, 112 is dependent on the shape of the fastener. The openings 130, 132 should have an upper portion and a lower portion. The breadth (i.e. the diameter where the heads are conical or cylindrical and either the length or width where the heads are shaped like a polygon) of the upper portion is larger than the breadth of the lower portion.

FIG. 4 shows assembly 100 having circuit board 104 attached to back plate 102 with countersunk flat head rivets 103, 105. Openings 130, 132, in circuit board 104 are conical to accommodate the conical shape of heads 210, 212 of flat head rivets 103, 105. The bottom of each of openings 130, 132 has about the same diameter as the stems of flat head rivets 103, 105. A portion of openings 130, 132 above the bottom has a diameter that is about the same as the largest diameter of heads 210, 212. The height of heads 210, 212 is about equal to or smaller than the depth of circuit board 104, so the entire head 210, 214 of each rivet 103, 105 fits between the top and bottom surface of circuit board 104. This makes the top surface of each of heads 210, 212 either level with or below top surface 150 of circuit board 104, such that no portion on flat head rivets 103, 105 protrudes above the top surface of assembly 100.

The stems of rivet 103, 105 fit into fastener openings 110, 112. The end of each of flat head rivets 103, 105 has round or oval balls 214, 216. When the rivets are actuated, balls 214, 216 are pulled through the stems. The stems surround balls 214, 216, widening the stems. Balls 214, 126 are pulled through the stems until fastener openings 110, 112 do not permit the stems to be further expanded in diameter. Recessed areas 111, 113 at the bottom of fastener openings 110, 112 are large enough to accommodate the widened stems surrounding balls 214, 216 such that no portion of the stems or balls 214, 216 protrudes below the bottom of back plate 102. This allows the entire bottom surface of the back plate to be in contact with the equipment or device into which the assembly is inserted. The equipment or device provides a large surface area to assist components 106, 108 with heat dissipation. In an alternative embodiment of the invention, the back plate does not have recessed areas III, 113 and balls 214, 216 protrude below the bottom of the back plate. The back plate without recessed area is easier to manufacture, but it should be used where a large contact between the back plate and the equipment or device is not needed to assist with heat dissipation.

Figure 5:
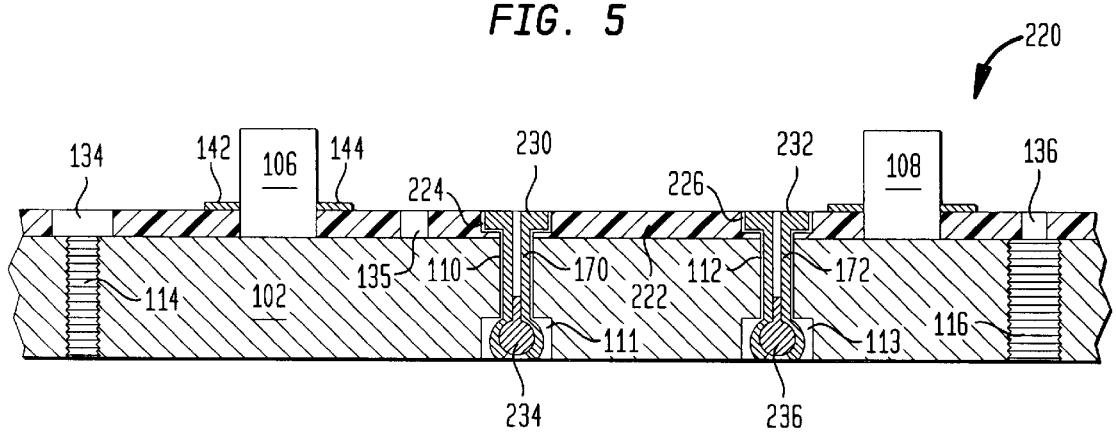
FIG. 5 is a cross-sectional view of an assembly having a back plate attached to a circuit board with button head rivets according to one embodiment of the present invention.

FIG. 5 shows an assembly 220 having circuit board 222 attached to back plate 102 with button-head rivets 170, 172. Openings 224, 226 in circuit board 222 are cylindrical to accommodate the cylindrical shape of heads 230, 232 and of the stems of rivets 170, 172. Openings 224, 226 have a top and bottom portion. The diameter of the top portion of each of openings 224, 226 is about the same as the largest diameter of heads 230, 232. The diameter of the bottom portion of openings 224, 226 is about the a little larger than the diameter of the stems of rivets 170, 172 but smaller than the diameter of the heads 230, 232. The height of heads 230, 232 is smaller than the depth of the top portion of openings 224, 226, so the entire head of each of rivets 170, 172 fits between the top and bottom surface of circuit board 222. This makes the top of surface of each of heads 230, 232 either level with or below the top surface of circuit board 222 such that no portion of button head rivets 170, 172 protrudes above the top surface of assembly 220.

The stems of rivets 170, 172 fit into fastener openings 110, 112. Like the flat head rivets, the ends of button-head rivets 170, 172 have a round or oval balls 234, 236 that widen the stems. Recessed areas 111, 113 at the bottom of fastener openings 110, 112 are large enough to accommodate the widened stems surrounding balls 234, 236 such that the no portion of stems or balls 234, 236 protrudes below the bottom of back plate 102.

Figure 6A:
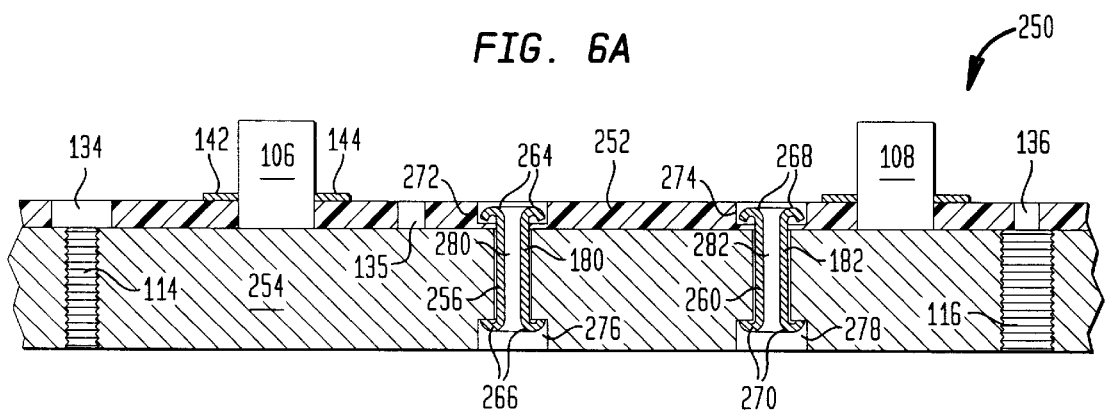
FIG. 6a is a cross-sectional view of an assembly having a back plate attached to a circuit board with eyelets according to one embodiment of the present invention.

FIG. 6a shows an assembly 250 having circuit board 252 attached to back plate 254 with eyelets 180, 182. Each eyelet 180, 182 is composed of one of tubular elements 256, 260. Heads 30 264, 268 and ends 266, 270 of the eyelets are the edges of tubular elements 256, 260 bent to hold the material between heads 264, 268 and ends 266, 270. As can be seen in FIG. 6a, the final shape of eyelets 180, 182 resembles the letter I.

Figure 6B:
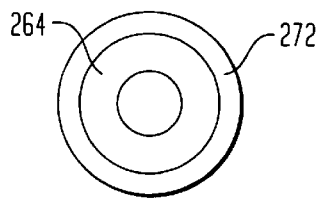
FIG. 6b is a top view the head of an eyelet in an opening in a circuit board of FIG. 6a according to one embodiment of the present invention.

FIG. 6b shows a top view of opening 272 in circuit board 252. Referring to FIGS. 6a and 6b, openings 272, 274 are cylindrical to accommodate the shape of heads 264, 268 of eyelets 180, 182. Openings 272, 274 have a top and bottom portion. The height of heads 264, 268 is smaller or about the same size as the depth of the top portion of openings 272, 274. The heads 264, 268 of each of eyelets 180, 182 fit between the top and bottom surface of circuit board 252. This makes the top of surface of heads 264, 268 either level with or below the top surface of circuit board 252 such that no portion of eyelets 180, 182 protrudes above the top surface of assembly 250.

The diameter of the top portion of each of openings 272, 274 is about the same as the largest diameter of heads 230, 232. The diameter of the bottom portion of openings 272, 274 is about the same as the diameter of the stem of each of eyelets 180, 182. Recessed areas 276, 278 at the bottom of fastener openings 280, 282 are large enough to accommodate the bent in portion of tubular elements 256, 260 that forms ends 266, 270 of eyelets 180, 182 such that no portion of eyelets 180, 182 protrudes below the bottom of back plate 254.

Figure 6C:
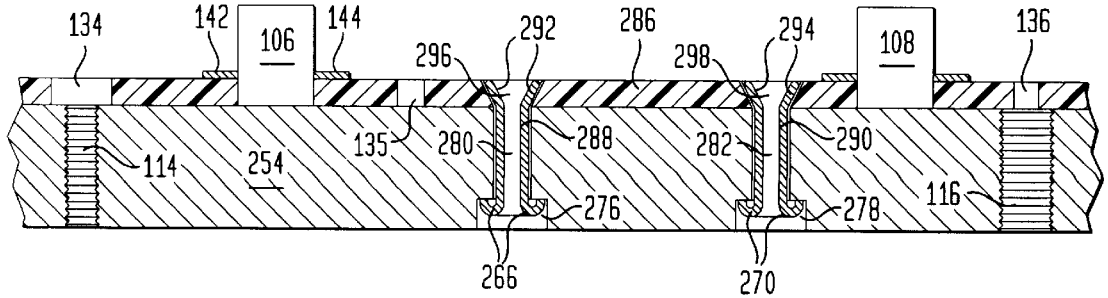
FIG. 6c is a cross-sectional view of an assembly having a back plate attached to a circuit board with funnel head eyelets according to one embodiment of the present invention.

FIG. 6c shows an assembly 284 having circuit board 286 attached to back plate 254 with funnel head eyelets 288, 290. Like eyelets 180, 182, funnel head eyelets 288, 290 are composed of one tubular element. Heads 292, 294 and ends 266, 270 of the funnel head eyelets 288, 290 are the edges of tubular elements. One edge of the tubular elements are bent outward to press against the bottom of the recessed area 276, 278 of the back plate 254, forming ends 266, 270. The other edge of the tubular elements are bent outward to form a conical shape, forming heads 292, 294 of funnel head eyelets 288, 290.

Openings 296, 298 in circuit board 286 are conical to accommodate the shape of heads 292, 294. The bottom of each of openings 296, 298 has about the same diameter as the diameter of the stem of the funnel head eyelets 288, 290. A portion of openings 296, 298 above the bottom has a diameter that is about the same as the largest diameter of heads 292, 294. The height of heads 292, 294 is about equal to or smaller than the depth of circuit board 284, so the entire head 292, 293 of funnel head eyelets 288, 290 fits between the top and bottom surface of circuit board 284. Thus, the top surface of each of heads 292, 294 either level with or below top surface of circuit board 254 such that no portion of funnel head eyelets 288, 290 protrudes below the bottom of back plate 254.

Figure 7:
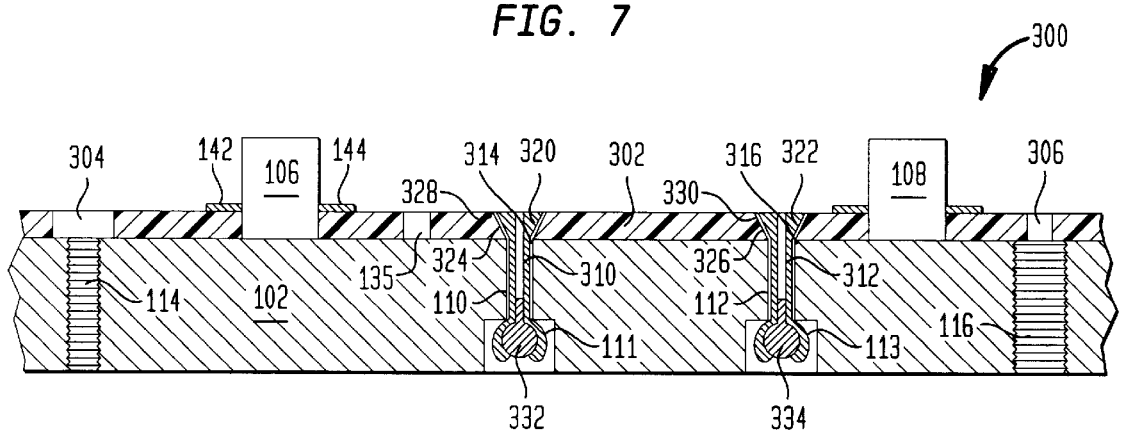
FIG. 7 is a cross-sectional view of another assembly having a back plate attached to a circuit board with countersunk rivets according to one embodiment of the present invention.

FIG. 7 illustrates the second type of fastener that can be recessed into the circuit board and still attach the circuit board to the back plate. The fasteners, such as flat head rivets 310, 312 have heads 320, 322 whose heights are larger than the depth of the circuit board 102, and that are shaped such that a bottom portion of heads 320, 322 has a diameter that can fit into fastener openings 110, 112. A second portion of heads 320, 322, above the bottom portion, has a larger diameter. In this case, it is important to ensure that first portions 324, 326 of openings 314, 316 in circuit board 302 have a diameter smaller than the largest diameter of heads 320, 322, and that second portions 328, 330 of openings 314, 316, above first portions 324, 326 have a diameter about as large as the largest diameter of heads 320, 322. Openings 314, 316, in circuit board 304 are conical to accommodate the conical shape of heads 320, 322.

A portion of heads 320, 322 and stems fit into fastener openings 110, 112. The height of the portion of each of heads 320, 322 that does not fit into fastener openings 110, 112 is about equal to or smaller than the depth of circuit board 302. As a result the top surface of heads 320, 322 is either level with or below the top surface of circuit board 302, such that no portion on flat head rivets 310, 312 protrudes above the top surface of assembly 300.

The end of rivets 310, 312 has round or oval balls 332, 334 that widen the stems. Recessed areas 111, 113 at the bottom of fastener openings 110, 112 are large enough to accommodate the widened stems surrounding balls 332, 334 such that the no portion of the stems or balls 332, 334 protrudes below the bottom of back plate 102.

Figure 8:
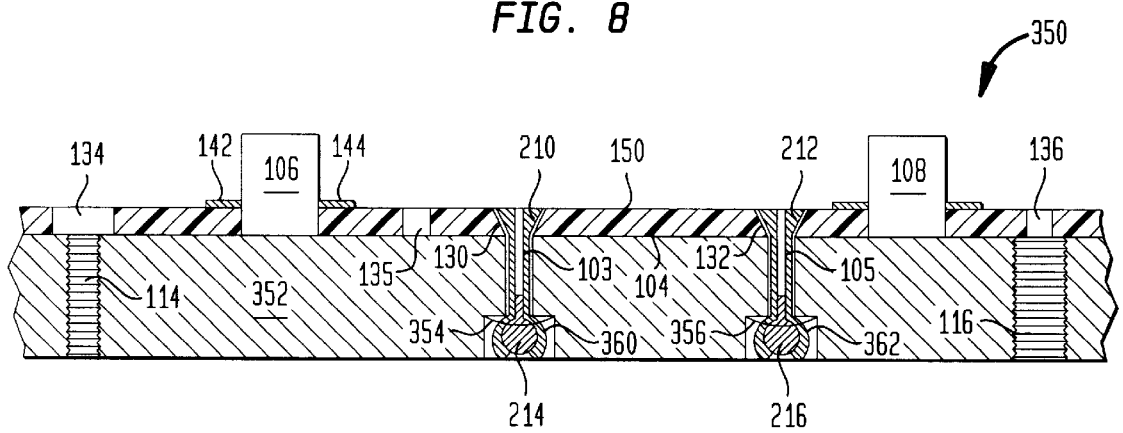
FIG. 8 is a cross-sectional view of an assembly having a back plate attached to a circuit board with rivets and washers according to the embodiment of the present invention.

FIG. 8 shows assembly 350, similar to assembly 100 of FIG. 4, fastened by countersunk rivets 103, 105. Over time as circuit board 104 is exposed to natural elements and as force is exerted on the circuit board, the circuit board material may creep, which will reduce the thickness of the circuit board. A brace, preferably spring-type washer 354 or 356, such as a Belleville washer, is added to the rivets 103, 105 to compensate for any creep in the circuit board material that may take place over time. The inner edge of each of washers 354, 356 goes around one of rivets 103, 105 at the junction of the widened portion of the stem, pressing against the widened portion of the stem. The outer edge of washers 354, 356 presses against the top surface of recessed areas 360, 362 of fastener opening 364, 366. If the circuit board material or the back plate material creeps over time, the washer extends vertically extending pressure against the back plate and the widened portion of the stem. This keeps the circuit board and back plate tightly pressed together.

Referring again to FIGS. 3 and 4, a method of fabricating assembly 100 will now be described. Back plate 102 is machined. Fastener openings 110, 112 are then formed in back plate 102. Recessed areas 111, 113 of fastener openings 110, 112 can be machined or counterbored when back plate 102 is fabricated, or they can be drilled after faster openings 110, 112 are made. Opening 118 in the back plate to accommodate component 108 is typically machined when back plate 102 is fabricated. Other openings 114, 116 are typically drilled or counterbored afterwards.

Openings 130, 132 are formed in circuit board 104. The circuit board can be a multi-layer or a single layer circuit board. In a multi-layer circuit board 104, circuit board 104 is first laminated. An opening having a diameter smaller than the largest diameter of the head is drilled through layers 120, 122, 124, 126, 128 of circuit board 104. A larger opening is counterbored, countrsunk or drilled in top layer 120 of circuit board 104 around the drilled opening, at least portion of the opening in the top layer has a diameter as large as the largest diameter of the head of the fastener. A portion of each opening has a diameter as large as the diameter of the top surface of fasteners 103, 105. Circuit board 104 is then electroplated. In a single layer circuit board, since there is only one layer, forming opening in the layers below the top layer is not needed.

The preferred fasteners have countersunk heads, such as the flat head rivets 103, 105. It is easier to reliably plate countersunk openings 130, 132 than openings with two portions with different diameters that have straight wall, because the straight walls create a sharp edge between the two portions. It is more difficult to ensure that the plating solution is deposited in the sharp edges, which can cause the opening to not be completely electroplated This can prevent the opening from conducting current between the ground layers on the circuit board and between the ground layers and the back plate, which also acts as a grounding plane.

Rivets 103, 105 are then placed in fastener openings 110, 112 and openings 130, 132 in the circuit board. A riveting tool actuates rivets 103, 105 to attach circuit board 104 to back plate 102. Because of the sizes of openings 130, 132 in circuit board 104, the top surface of heads 210, 212 of the rivets fits entirely within the openings 130, 132 such that it is either flush with the top surface of assembly 100, or below the top surface of assembly 100. Optionally, braces are attached to rivets 103, 105 and to the outer surface of back plate 102. The braces are preferably spring-type washers such as Belleville washers. The inner edge of the washers fit around rivets 103, 105, at the junction of the widened part of the stems and the rest of the stems. The outer edge of the washers presses against the top surface of recessed areas 111, 113.

A solder paste stencil is placed on the top surface of circuit board 104. The solder paste stencil exposes areas of the circuit board where components 106, 108 need to be soldered onto circuit board 104. Solder is placed over the solder paste stencil depositing solder on the exposed area of circuit board 104. The solder paste stencil is then removed and leads 142, 144, and 146, 148 of components 106, 108 are attached to solder on circuit board 104.

Optionally, screws, not shown, can be added to the assembly, after the components are attached to the assembly. The screws further assist in ensuring that the back plate and circuit board are securely attached.

While the invention has been described with reference to a preferred embodiment, it will be understood by those skilled in the art having reference to the specification and drawings that various modifications may be made and various alternatives are possible therein without departing from the spirit and scope of the invention.

I claim:

1. An assembly comprising:

a back plate having a fastener opening extending into the back plate, the back plate having a top and bottom surface, the fastener opening extends between the top and bottom surfaces of the back plate;

a circuit board having a top and bottom surface and an opening extending between the top and bottom surfaces, the opening having an upper and lower portion, the upper portion having a breadth larger than a breadth of the lower portion, the opening aligned with the fastener opening;

a fastener having an end and a head with a top surface, the fastener inserted into the opening in the circuit board and into the fastener opening to couple the circuit board and back plate, at least a portion of the head being positioned in the opening in the circuit board such that the top surface of the head does not protrude beyond the top surface of the circuit board, and the circuit board and back plate being coupled such that the bottom surface of the circuit board is adjacent to the top surface of the back plate;

the back plate includes a recessed area in the bottom surface of the back plate, surrounding the fastener opening, the recessed area having a top surface; and a brace contacting the fastener and the back plate, the brace being a spring type washer having an outer edge contacting the top surface of the recessed area and an inner edge contacting the fastener.

2. The assembly of claim 1, wherein the fastener is a pop rivet.

3. The assembly of claim 1, wherein:

the fastener is a flat head rivet; and the opening in the circuit board is conical.

4. The assembly of claim 1, wherein:

the fastener is a button head rivet; and the upper and lower portions of the opening is cylindrical.

5. The assembly of claim 1, wherein:

the fastener is an eyelet; and the upper and lower portions of the opening is cylindrical.

6. The assembly of claim 1, wherein the top surface of the head is level with the top surface of the circuit board.

7. The assembly of claim 1, wherein the circuit board comprises a printed wiring board.

* * * * *